US006809557B2

(12) United States Patent
Gauthier et al.

(10) Patent No.: US 6,809,557 B2
(45) Date of Patent: Oct. 26, 2004

(54) INCREASING POWER SUPPLY NOISE REJECTION USING LINEAR VOLTAGE REGULATORS IN AN ON-CHIP TEMPERATURE SENSOR

(75) Inventors: Claude Gauthier, Fremont, CA (US); Spencer Gold, Pepperell, MA (US); Dean Liu, Sunnyvale, CA (US); Kamran Zarrineh, Billerica, MA (US); Brian Amick, Austin, TX (US); Pradeep Trivedi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/078,130

(22) Filed: Feb. 19, 2002

(65) Prior Publication Data

US 2003/0155964 A1 Aug. 21, 2003

(51) Int. Cl.[7] .................................................. H03B 5/04
(52) U.S. Cl. ........................ 327/101; 327/513; 331/176
(58) Field of Search ................................. 327/101, 113, 327/513; 330/256; 331/66, 70, 176

(56) References Cited

U.S. PATENT DOCUMENTS

| | | | | |
|---|---|---|---|---|
| 3,379,214 | A | 4/1968 | Weinberg | 137/625.5 |
| 4,165,642 | A | 8/1979 | Lipp | 374/170 |
| 4,201,087 | A | 5/1980 | Akita et al. | 374/119 |
| 4,305,041 | A | 12/1981 | Frerking | 327/39 |
| 4,371,271 | A | 2/1983 | Bellet | 374/183 |
| 4,551,031 | A | 11/1985 | Ishikawa et al. | 374/117 |
| 4,559,954 | A | 12/1985 | Murase | 600/549 |
| 4,658,407 | A | 4/1987 | Iwama | 377/25 |
| 4,692,710 | A | 9/1987 | Shvartsman | 327/26 |
| 4,754,760 | A | 7/1988 | Fukukita et al. | 600/438 |
| 4,905,701 | A | 3/1990 | Cornelius | 600/437 |
| 5,085,526 | A | 2/1992 | Sawtell et al. | 374/101 |
| 5,097,198 | A | 3/1992 | Holmdahl | 323/280 |
| 5,193,387 | A | 3/1993 | Hodate | 73/146.5 |
| 5,214,668 | A | 5/1993 | Satou et al. | 374/117 |
| 5,291,607 | A | 3/1994 | Ristic et al. | 713/300 |
| 5,485,127 | A | 1/1996 | Bertoluzzi et al. | 331/69 |
| 5,490,059 | A | 2/1996 | Mahalingaiah et al. | 700/46 |
| 5,546,810 | A | 8/1996 | Arikawa et al. | 73/702 |

(List continued on next page.)

OTHER PUBLICATIONS

Gunther et al. "Managing the impact of increasing microprocessor power consumption." pp. 1–9 http://www.intel-.com/technology/jti/g12001/articles/art 4.htm (2001) Intel Technology Journal Q1.

(List continued on next page.)

*Primary Examiner*—Timothy P. Callahan
*Assistant Examiner*—Terry L. Englund
(74) *Attorney, Agent, or Firm*—Osha & May L.L.P.

(57) ABSTRACT

An apparatus that uses a linear voltage regulator to reject power supply noise in a temperature sensor is provided. Further, a method for using a linear voltage regulator to reject power supply noise in a temperature sensor is provided. Further, a method and apparatus that uses a differential amplifier with a source-follower output stage as a linear voltage regulator for a temperature sensor is provided.

7 Claims, 6 Drawing Sheets

U.S. PATENT DOCUMENTS

| | | | | | |
|---|---|---|---|---|---|
| 5,626,425 | A | | 5/1997 | Fujikawa et al. | 374/163 |
| 5,638,418 | A | | 6/1997 | Douglass et al. | 377/25 |
| 5,781,075 | A | | 7/1998 | Bolton, Jr. et al. | 331/176 |
| 5,781,718 | A | | 7/1998 | Nguyen | 714/33 |
| 5,832,048 | A | | 11/1998 | Woodman, Jr. | 375/376 |
| 5,836,691 | A | | 11/1998 | Yamauchi | 374/117 |
| 5,838,578 | A | | 11/1998 | Pippin | 716/4 |
| 5,870,614 | A | | 2/1999 | Ang | 713/320 |
| 5,873,053 | A | | 2/1999 | Pricer et al. | 702/130 |
| 5,892,408 | A | | 4/1999 | Binder | 331/44 |
| 5,892,448 | A | | 4/1999 | Fujikawa et al. | 340/584 |
| 5,933,039 | A | | 8/1999 | Hui et al. | 327/262 |
| 5,953,640 | A | | 9/1999 | Meador et al. | 455/73 |
| 5,977,840 | A | * | 11/1999 | Connell et al. | 331/176 |
| 6,040,744 | A | * | 3/2000 | Sakurai et al. | 331/176 |
| 6,098,030 | A | | 8/2000 | McMinn | 702/132 |
| 6,115,441 | A | | 9/2000 | Douglass et al. | 377/25 |
| 6,219,723 | B1 | | 4/2001 | Hetherington et al. | 710/18 |
| 6,362,699 | B1 | * | 3/2002 | Fry | 331/176 |
| 6,363,490 | B1 | | 3/2002 | Senyk | 713/300 |
| 6,463,396 | B1 | | 10/2002 | Nishigaki | 702/132 |
| 2001/0021217 | A1 | | 9/2001 | Gunther et al. | 374/178 |
| 2002/0180544 | A1 | * | 12/2002 | Fukayama et al. | 331/176 |
| 2003/0052331 | A1 | | 3/2003 | Gauthier et al. | 257/168 |
| 2003/0155903 | A1 | | 8/2003 | Gauthier et al. | 324/76.41 |
| 2003/0155965 | A1 | | 8/2003 | Gauthier et al. | 327/540 |
| 2003/0156622 | A1 | | 8/2003 | Gold et al. | 374/170 |
| 2003/0158683 | A1 | | 8/2003 | Gauthier et al. | 702/99 |
| 2003/0158696 | A1 | | 8/2003 | Gold et al. | 702/132 |
| 2003/0158697 | A1 | | 8/2003 | Gold et al. | 702/132 |

OTHER PUBLICATIONS

Intel Corporation "Mobile Pentium II Processor and Pentium II Processor Mobile Module Thermal Sensor Interface specifications," 13 pages (Apr. 1988) http://www.intel.com/design/mobile/applnots/24372401.pdf.

"Remote/Local Temperature Sensor with SMBus Serial Interface" Maxim MAX1617 19–1265; Rev 1: 3/98, pp. 1–20.

"2–Wire Digital Termometer and Thermostat" Dallas Semiconductor DS1721 Dec. 29, 1998, pp. 1–14.

"High Resolution Temperature Measurement with Dallas Direct–to–Digital Temperature Sensors" Dallas Semiconductor Application Note 105, pp. 1–20.

"Intel Pentium 4 Processor in the 423–pin Package Termal Design Guidelines" Order No. 249203–001 Nov., 2000, pp. 1–28.

* cited by examiner

INCREASING POWER SUPPLY NOISE REJECTION USING LINEAR VOLTAGE REGULATORS IN AN ON-CHIP TEMPERATURE SENSOR

This application contains subject matter that may be related to that contained in the following U.S. applications filed on Feb. 19, 2002 and assigned to the assignee of the instant application: "A Method and System for Monitoring and Profiling an Integrated Circuit Die Temperature" (U.S. patent application Ser. No. 10/079,476.), "An Integrated Temperature Sensor" (U.S. patent application Ser. No. 10/080,037.), "A Controller for Monitoring Temperature" (U.S. patent application Ser. No. 10/079,475.), "Temperature Calibration Using On-Chip Electrical Fuses" (U.S. patent application Ser. No. 10/078,760.), "Low Voltage Temperature-Independent and Temperature-Dependent Voltage Generator" (U.S. patent application Ser. No. 10/078, 760)(issued as 6,605,988 on Aug. 12, 2003), and "Quantifying a Difference Between Nodal Voltages" (U.S. patent application Ser. No. 10/078,945,).

BACKGROUND OF INVENTION

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer system (10) having a microprocessor (12), memory (14), integrated circuits (ICs) (16) that have various functionalities, and communication paths (18), i.e., buses and wires, that are necessary for the transfer of data among the aforementioned components of the computer system (10).

As circuit elements continue to get smaller and as more and more circuit elements are packed onto an IC, ICs (16) dissipate increased amounts of power, effectively causing ICs (16) to run hotter. Consequently, increased operating temperatures create a propensity for performance reliability degradation. Thus, it is becoming increasingly important to know the temperature parameters in which a particular IC operates.

The temperature level in an IC is typically measured by producing a voltage proportional to temperature, i.e., a temperature-dependent voltage. It is also useful to produce a temperature-independent voltage, i.e., a voltage insensitive to temperature, that can be processed along with the temperature-dependent voltage to allow for cancellation of process variations (circuit inaccuracies introduced during the manufacturing stage) and supply variations (fluctuations in the input voltage or current of a circuit).

FIG. 2 shows a typical temperature measurement technique using a temperature-dependent and temperature-independent voltage generator ("TIDVG"). The TIDVG (22) resides on a portion of an integrated circuit, such as a microprocessor (20), in order to measure the temperature at the portion of the microprocessor (20) on which the TIDVG resides. The TIDVG (22) generates a temperature-dependent voltage (24) representative of the temperature and a temperature-independent voltage (26), which are used as power supplies for a voltage-to-frequency ("V/F") converter (28) (also referred to as "voltage controlled oscillator" or "VCO") disposed on the microprocessor (20). The V/F converter (28) converts the temperature-dependent voltage (24) and the temperature-independent voltage (26) to frequencies that can be used by other components of the microprocessor (20).

However, this technique is prone to inaccuracy because fluctuations in the V/F converter's (28) power supplies may adversely affect the frequencies generated by the V/F converter (28). For example, in FIG. 3, a voltage regulator (100), in this case a PMOS transistor, controls current flow to the V/F converter (28). If the power supply to the voltage regulator (100) varies due to power variations, then current flow to the V/F converter (28) also accordingly varies. If left unchecked, these power variations, known as power supply noise, can corrupt data and/or signals associated with the temperature-dependent and temperature-independent voltages (24 and 26, respectively), and may cause erroneous temperature measurements. Further, power supply noise is one of the few noise sources that cannot be nulled during calibration. Because erroneous temperature measurements can cause erroneous system behavior, e.g., unnecessary shutdown of the computer system, there is a need for reducing the amount of noise present in a V/F converter's (28) power supplies. In other words, there is a need for a technique to increase power supply noise rejection in an on-chip temperature sensor.

SUMMARY OF INVENTION

According to one aspect of the present invention, an integrated circuit having a temperature sensor disposed thereon comprises a voltage generator that outputs a voltage representative of a temperature on the integrated circuit; a voltage regulator that uses feedback to decouple power supply noise from the voltage; and a voltage-to-frequency converter that generates a frequency using the voltage as a control voltage for the voltage-to-frequency converter, where the frequency is representative of the temperature.

According to another aspect, an apparatus for rejecting power supply noise on a voltage signal generated by a voltage generator comprises means for generating a differential voltage in relation to the voltage signal; means for generating an output voltage based on the differential voltage; and means for generating a buffered power supply voltage in relation to the output voltage.

According to another aspect, a method for rejecting power supply noise on a voltage signal generated by a voltage generator comprises generating an output voltage based on a differential voltage, where the output voltage is generated by an output stage; and generating a buffered power supply voltage in relation to the output voltage, where the buffered power supply voltage is generated by the output stage.

Other aspects and advantages of the invention will be apparent from the following description and the appended claims.

DETAILED DESCRIPTION

Embodiments of the present invention relate to a method and apparatus that uses a linear voltage regulator to reject power supply noise in a temperature sensor. Embodiments of the present invention further relate to a method and apparatus that uses a differential amplifier with a source-follower output stage as a linear voltage regulator for a temperature sensor.

The present invention uses a linear voltage regulator to increase power supply noise rejection in a technique used to measure a temperature on an integrated circuit. The linear voltage regulator regulates its output voltage by inputting the output voltage as feedback. By incorporating linear voltage regulators into such a temperature measurement technique, the amount of noise present in a temperature measurement of an integrated circuit may be reduced. Further, because the linear regulator uses feedback to regulate its output voltage, the output voltage may be maintained at a substantially constant value over a wide range of power supply variations.

Figure 1:
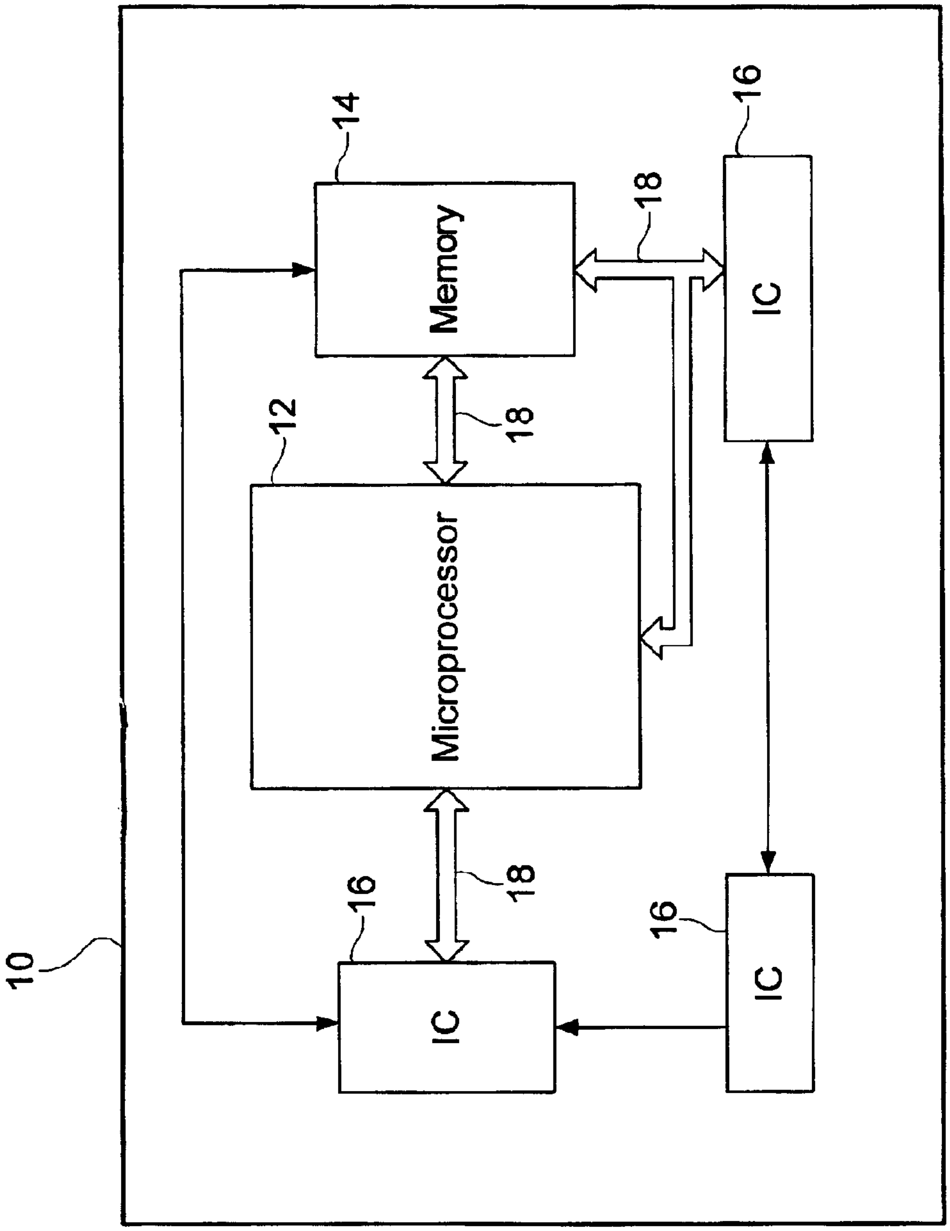
FIGURE 1 (Prior Art)
FIG. 1 shows a typical computer system.
Figure 2:
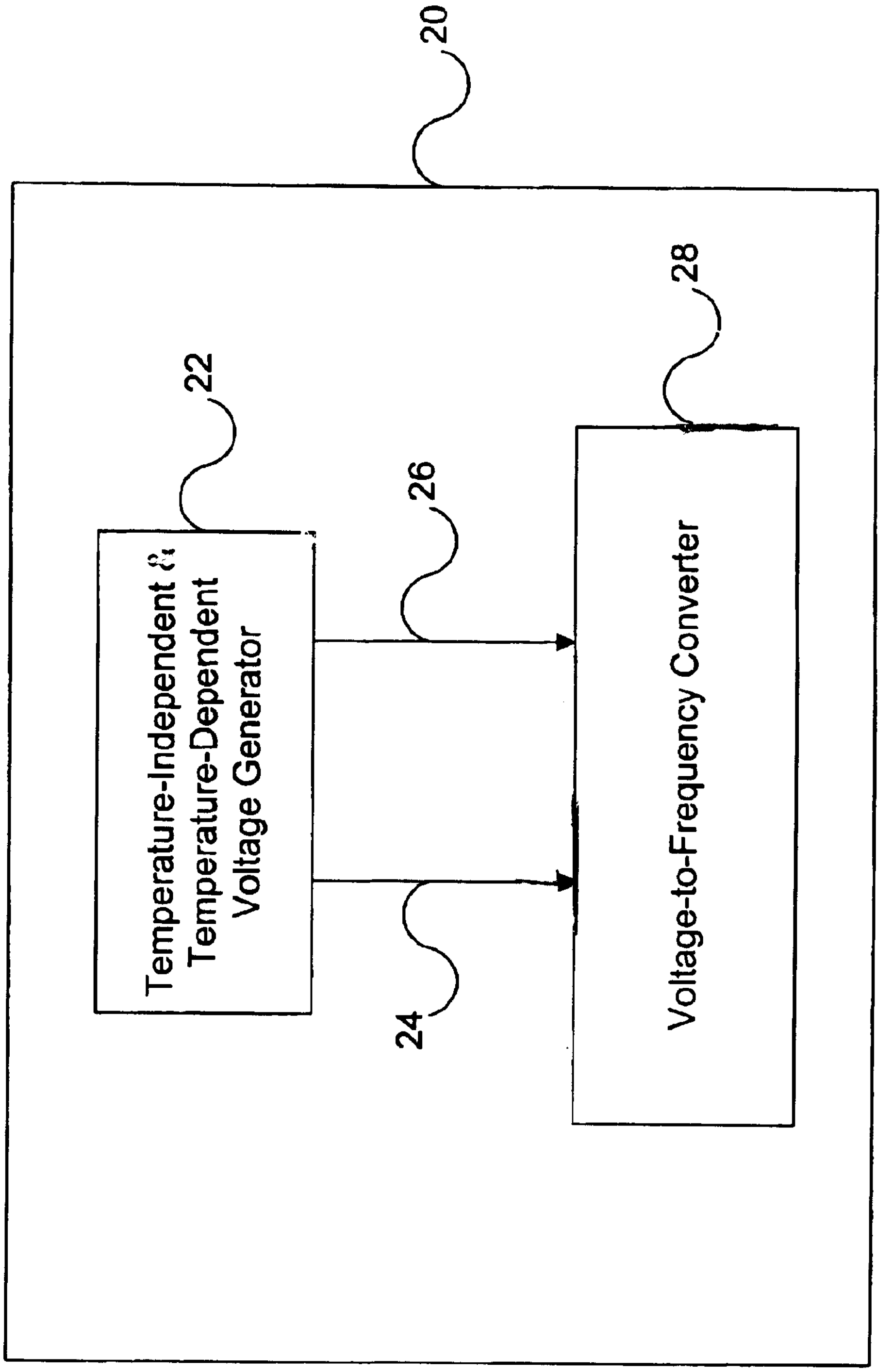
Figure 2 (Prior Art)
FIG. 2 shows a typical temperature measurement technique.
Figure 3:
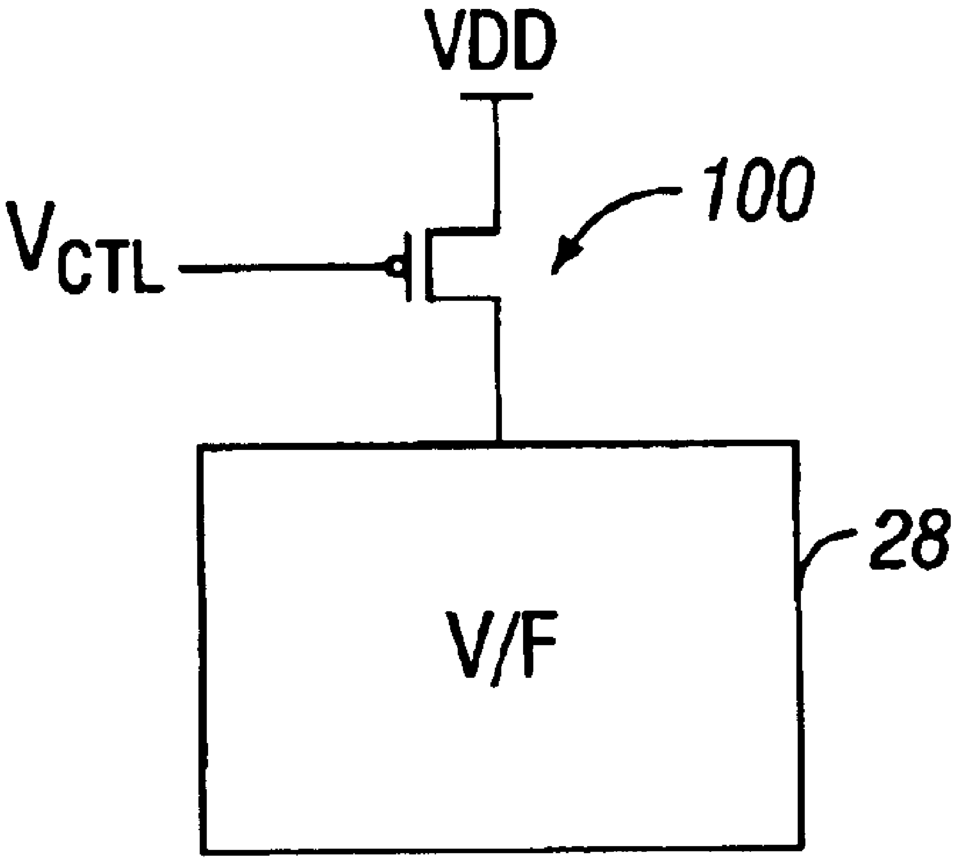
FIG. 3 (PRIOR ART)
FIG. 3 shows a typical voltage regulator implementation.
Figure 4:
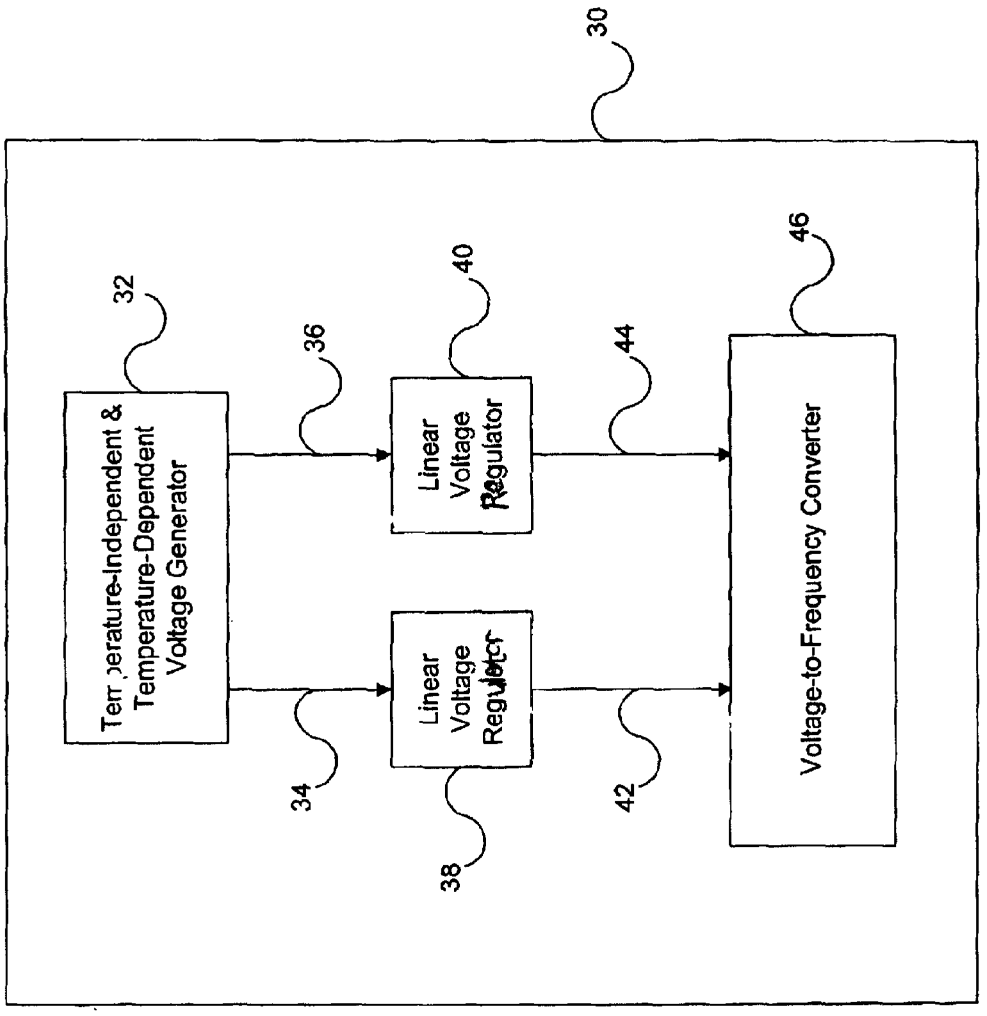
FIG. 4 shows a block diagram in accordance with an embodiment of the present invention.

FIG. 4 shows an exemplary block diagram in accordance with an embodiment of the invention. A temperature-dependent voltage (34) and a temperature-independent voltage (36) produced by a temperature-dependent and temperature-independent voltage generator (32) are each fed through a linear voltage regulator (38 and 40, respectively). The first linear voltage regulator (38) rejects power supply noise so that the temperature-dependent voltage (42) is not affected by power supply noise. The second linear regulator (40) rejects power supply noise so that the temperature-independent voltage (44) is not affected by power supply. The voltages (42, 44) outputted by the linear regulators (38, 40) each control a voltage-to-frequency converter (46), which converts the voltages (42, 44) into frequencies that are subsequently used to determine actual temperatures. In effect, the linear regulators (38, 40) buffer the voltages (42, 44) to the voltage-to-frequency converter (46).

Figure 5:
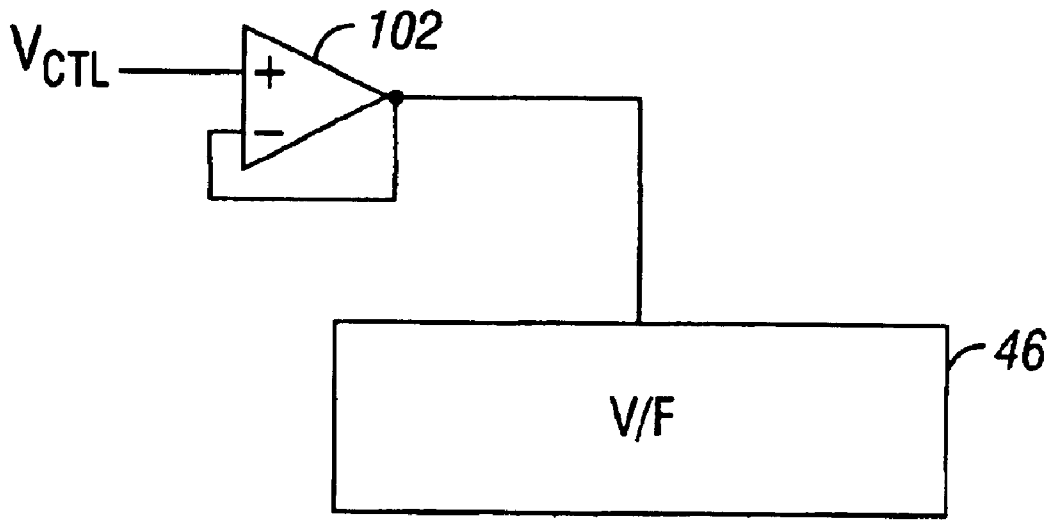
FIG. 5 shows a linear voltage regulator implementation in accordance with an embodiment of the present invention.

FIG. 5 shows an exemplary linear voltage regulator (102) in accordance with an embodiment of the present invention. The voltage regulator (102) is essentially an amplifier that has its output connected to its input. Such a feedback configuration allows the output of the voltage regulator (102) to be unaffected by power supply noise on the amplifier. The output of the voltage regulator (102) has a voltage equal to that of the input to the voltage regulator (102), where the input may either be a temperature-dependent voltage or a temperature-independent voltage. Moreover, the output of the voltage regulator (102) serves to control the V/F converter (46). Thus, those skilled in the art will appreciate that such a linear voltage regulator configuration in a temperature sensor allows for the effective decoupling of power supply noise from a temperature-dependent voltage and/or a temperature-independent voltage.

Figure 6:
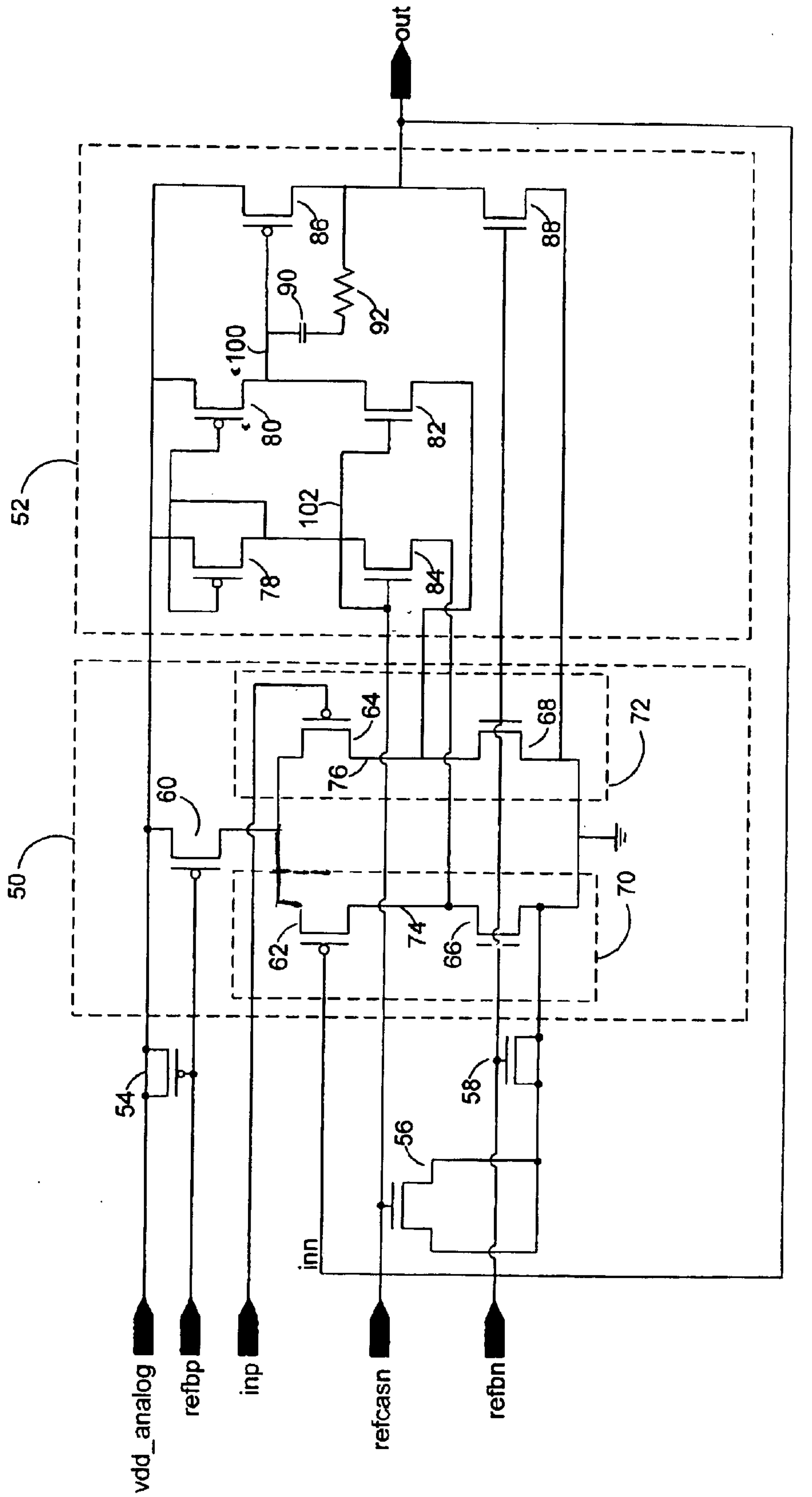
FIG. 6 shows a circuit in accordance with an embodiment of the present invention.

FIG. 6 shows an exemplary circuit schematic of a linear voltage regulator in accordance with an embodiment of the present invention. The linear voltage regulator has an output out and the following inputs: vdd_analog, refbp, inp, inn, refcasn, and refbn. Inputs refbp, refcasn, and refbn are used as bias inputs, and input vdd_analog is used as the power supply. Input inp is the temperature input (either a temperature-dependent voltage or a temperature-independent voltage) to the linear voltage regulator and input inn is the feedback voltage from the output of the linear voltage regulator. As shown in FIG. 6, feedback is provided between the output out output of the linear voltage regulator and input inn. This allows output out output to be regulated using feedback so that output out is stable and substantially immune to power supply noise on input vdd_analog.

Still referring to FIG. 6, the linear voltage regulator shown has a set of decoupling capacitors (54, 56, 58), a differential amplifier stage (50), and an output stage (52). A first decoupling capacitor (54) is attached to the vdd_analog and refbp inputs. A second decoupling capacitor (56) is attached to the refcasn input, and a third decoupling capacitor (58) is attached to the refbn input. Each of the decoupling capacitors (54, 56, 58) act to stabilize the nodes they are connected to in the presence of power supply noise.

The differential amplifier stage (50) has a differential amplifier that receives input from inputs vdd_analog, refbp, inp, inn, and refbn. The differential amplifier processes the difference between inp and inn to remove power supply variations, i.e., noise, common to both inputs.

The fourth and fifth transistors (66, 68) act as current sources and are used to provide current to the second and third transistors (62, 64), respectively. The second and third transistors (62, 64) are the active devices of the differential amplifier, and thus, are used to generate differential output voltages (74, 76) for the inn and inp inputs. The bias current provided by the first transistor (60) is used to center the differential output voltage (74, 76) of each common source amplifier (70, 72) such that the voltage difference between the differential output voltages (74, 76) is substantially zero. The differential output voltages (74, 76) are outputted to the output stage (52).

The output stage (52) receives inputs from vdd_analog, refcasn, refbn, and the differential output voltages (74, 76) generated by the differential amplifier stage (50). The output stage (52) is used to buffer the out output and reduce the output resistance of the linear voltage regulator.

The first transistor (78) and the second transistor (80) each act as current sources, where the current in the first transistor (78) is mirrored in the second transistor (80). Such a configuration of the first and second transistor (78, 80) helps guarantee that the current through the two branches is equal. The third and fourth transistors (84, 82) are load transistors that convert change in current into voltage. The fifth and sixth transistors (86, 88) are a source follower that drives the resistive load. In order to stabilize the out output, a loaded feedback path formed by the compensation capacitor (90) and the compensation resistor (92) attaches the second source follower voltage (100) to the drain terminal of the sixth transistor (88).

Advantages of the present invention may include one or more of the following. In some embodiments, because a linear voltage regulator is included in a microprocessor temperature measurement technique, power supply noise may be decoupled from a temperature-dependent voltage and/or a temperature-independent voltage.

In some embodiments, because a temperature sensor uses a differential amplifier having source follower output stage, power supply noise rejection may be increased so as to increase the integrity of temperature dependent and independent voltages that are used to control one or more voltage to frequency converters.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit having a temperature sensor disposed thereon, the temperature sensor comprising:

a voltage generator that outputs a first voltage representative of a temperature on the integrated circuit;

a voltage regulator that inputs the first voltage and outputs an output voltage, wherein the output voltage is fed back to an input of the voltage regulator; and a voltage-to-frequency converter that inputs the output voltage and generates a frequency, wherein the frequency is representative of the temperature, wherein the voltage regulator is a linear voltage regulator, and wherein the linear voltage regulator comprises a differential amplifier stage and an output stage.

2. The integrated circuit of claim 1, wherein the differential amplifier stage comprises a differential amplifier that generates a differential voltage.

3. The integrated circuit of claim 1, wherein the output stage decreases an output resistance of the differential amplifier stage.

4. The integrated circuit of claim 2, the output stage comprising:

circuitry that inputs the differential voltage, wherein the circuitry generates the output voltage.

5. The integrated circuit of claim 1, wherein the output voltage, regulator buffers the first voltage to generate the output voltage, and wherein the output voltage is operatively connected to an input of the linear voltage regulator by a leaded feedback path.

6. The integrated circuit of claim 4, wherein the output voltage is operatively connected to an input of the circuitry through a loaded feedback path.

7. The integrated circuit of claim 1, wherein the differential amplifier stage removes noise from the first voltage.

* * * * *

UNITED STATES PATENT AND TRADEMARK OFFICE

CERTIFICATE OF CORRECTION

PATENT NO. : 6,809,557 B2
DATED : October 26, 2004
INVENTOR(S) : Claude R. Gauthier et al.

It is certified that error appears in the above-identified patent and that said Letters Patent is hereby corrected as shown below:

Column 6,
Line 5, please replace “output” with -- linear --;
Line 6, please remove the comma after “voltage”;
Line 9, please remove the word “leaded”.

Signed and Sealed this

First Day of March, 2005

JON W. DUDAS
*Director of the United States Patent and Trademark Office*